United States Patent
Sakurai et al.

(10) Patent No.: US 8,083,150 B2
(45) Date of Patent: Dec. 27, 2011

(54) NONCONTACT INFORMATION STORAGE MEDIUM AND METHOD FOR MANUFACTURING SAME

(75) Inventors: Daisuke Sakurai, Osaka (JP); Michiro Yoshino, Osaka (JP)

(73) Assignee: Panasonic Corporation, Osaka (JP)

( * ) Notice: Subject to any disclaimer, the term of this patent is extended or adjusted under 35 U.S.C. 154(b) by 1097 days.

(21) Appl. No.: 11/918,054

(22) PCT Filed: Sep. 19, 2006

(86) PCT No.: PCT/JP2006/318475
§ 371 (c)(1),
(2), (4) Date: Oct. 9, 2007

(87) PCT Pub. No.: WO2007/034764
PCT Pub. Date: Mar. 29, 2007

(65) Prior Publication Data
US 2009/0039168 A1    Feb. 12, 2009

(30) Foreign Application Priority Data
Sep. 26, 2005    (JP) ................................ 2005-277735

(51) Int. Cl.
*G06K 19/06* (2006.01)
(52) U.S. Cl. ........ 235/492; 235/375; 235/380; 235/451; 235/487
(58) Field of Classification Search ............ 235/440, 235/487, 492, 375, 380, 451; 438/118, 119, 438/127; 257/684, 687, 688, 700, 713, 737; 343/700 MS
See application file for complete search history.

(56) References Cited

U.S. PATENT DOCUMENTS

| 4,889,980 | A | * | 12/1989 | Hara et al. ............. 235/488 |
| 4,962,415 | A | * | 10/1990 | Yamamoto et al. ......... 257/679 |
| 5,804,882 | A | | 9/1998 | Tsukagoshi et al. |
| 5,837,992 | A | * | 11/1998 | Onozawa ............. 235/488 |
| 6,666,380 | B1 | | 12/2003 | Suzuya |
| 6,683,369 | B2 | | 1/2004 | Iwamoto |
| 2002/0066793 | A1 | * | 6/2002 | Hayashi ............. 235/492 |
| 2002/0140069 | A1 | * | 10/2002 | Lee et al. ............. 257/678 |
| 2002/0192856 | A1 | | 12/2002 | Halope et al. |
| 2005/0212131 | A1 | | 12/2005 | Kawai |
| 2006/0065745 | A1 | * | 3/2006 | Kawai ............. 235/492 |

(Continued)

FOREIGN PATENT DOCUMENTS
DE    195 43 426 C1    5/1997
(Continued)

OTHER PUBLICATIONS

European Search Report issued in European Patent Application No. EP 06 79 8086, mailed Feb. 3, 2009.
(Continued)

*Primary Examiner* — Tuyen K Vo
(74) *Attorney, Agent, or Firm* — McDermott Will & Emery LLP (57) ABSTRACT

A non-contact information storage medium has IC chip having at least a function of storing information, and resin substrate having antenna pattern for communicating a signal to an external device. Antenna terminal disposed at one end of antenna pattern on resin substrate and electrode terminal of IC chip are mounted so that the antenna terminal faces the electrode terminal. Insulating layer for gap regulation of at least 5 μm is disposed between antenna pattern and circuit forming surface of IC chip.

6 Claims, 6 Drawing Sheets

U.S. PATENT DOCUMENTS

2006/0151620 A1 * 7/2006 Usami et al. .................. 235/492

FOREIGN PATENT DOCUMENTS

| | | |
|---|---|---|
| JP | 09-045731 | 2/1997 |
| JP | 09-266210 | 10/1997 |
| JP | 2000-114314 | 4/2000 |
| JP | 2000-295024 | 10/2000 |
| JP | 2001-144141 | 5/2001 |
| JP | 2002-298106 | 10/2002 |
| JP | 2003-031612 | 1/2003 |
| JP | 2003-288559 | 10/2003 |
| JP | 2005-71179 | 3/2005 |
| JP | 2005-242821 | 9/2005 |
| JP | 2005-275802 | 10/2005 |
| WO | WO 2004/006173 A2 | 1/2004 |

OTHER PUBLICATIONS

Japanese Office Action issued in Japanese Patent Application No. 2007-536480, mailed Jun. 15, 2010.

Japanese Office Action issued in Japanese Patent Application No. JP 2007-536480 dated Jan. 11, 2011.

* cited by examiner

NONCONTACT INFORMATION STORAGE MEDIUM AND METHOD FOR MANUFACTURING SAME

RELATED APPLICATIONS

This application is the U.S. National Phase under 35 U.S.C. §371 of International Application No. PCT/JP2006/318475, filed on Sep. 19, 2006, which in turn claims the benefit of Japanese Application No. 2005-277735, filed on Sep. 26, 2005, the disclosures of which Applications are incorporated by reference herein.

TECHNICAL FIELD

The present invention relates to a non-contact information storage medium that communicates with an external communication device such as a reader/writer (R/W) and can read or store signals including various information in a non-contact manner, and a manufacturing method of the non-contact information storage medium.

BACKGROUND ART

Recently, a technology related to a non-contact information storage medium (hereinafter referred to as "non-contact card") such as an identification (ID) card or radio frequency (RF) tag has been rapidly developed. The non-contact card includes an antenna pattern formed on a resin substrate or the like and a semiconductor integrated circuit (IC) chip (hereinafter referred to as "IC chip") connected to an antenna terminal disposed at one end of the antenna pattern.

Non-contact cards using a band of 13.56 MHz are presently used as a commuter pass or a prepaid card by a railroad company.

Such non-contact cards have been reduced in size and cost by technology development, and have been recently used in further various fields. For instance, they are used for constructing a uniform management system for production management or distribution management of articles or for managing the security of small articles or books. For spreading the use of the non-contact cards, further convenience enhancement and cost reduction of them are required. For instance, non-contact cards having flexibility are required, communication distance is required to be increased, and variation in communication distance is required to be decreased.

A structure for increasing the communication distance is disclosed in Japanese Patent Unexamined Publication No. 2002-298106 (hereinafter referred to as "Patent document 1"). This document shows a non-contact card having the following elements:
  an IC chip for storing data;
  an antenna for transmitting and receiving the data using electromagnetic wave in a non-contact manner; and
  a reflecting means that is faced to the antenna and reflects the electromagnetic wave toward the antenna.

The structure in Patent document 1 has the reflecting means, and hence can increase the communication distance without requiring a battery. This structure can keep the data reading/writing state constant regardless of material disposed on the rear surface.

For suppressing the variation in communication distance caused by characteristic variation of the base material when a microwave band is used, Japanese Patent Unexamined Publication No. 2005-71179 (hereinafter referred to as "Patent document 2") discloses a non-contact card. The non-contact card of Patent document 2 has the following elements:

a base material made of paper;
  a communicating means that is disposed in the base material, and transmits and receives data using electromagnetic wave that is supplied from an external reader/writer and is in a range from an ultrahigh frequency (UHF) band to a microwave band that is;
  an IC chip having a storing means for storing the data writably or only readably;
  an antenna unit made of an electric conductor connected to the IC chip; and
  a covering layer that is disposed between the base material and the antenna unit and is made of material that has water resistance and hardly varying dielectric constant.

For achieving the miniaturization while securing the communication distance, Japanese Patent Unexamined Publication No. 2000-295024 (hereinafter referred to as "Patent document 3") discloses a non-contact tag having the following structure. The non-contact tag has an antenna substrate including the following elements:
  a dielectric substrate having a predetermined dielectric constant; and
  flat antenna coils separately formed using an antenna conductor on both sides of the dielectric substrate so that the current flows in the same direction.

In the non-contact card of Patent document 1, however, the interval between the antenna and the reflecting means depends on the wavelength of the electromagnetic wave used for reading and writing data. Therefore, this interval is required to be set at a predetermined interval in order to increase the communication distance. When the wavelength is 2.45 GHz, for example, the interval is required to be at least 7.7 mm. In this method, the communication distance can be increased, but it is difficult to achieve a thin non-contact card.

Patent document 2 shows that the drift of the resonance frequency of the antenna unit can be reduced by suppressing the variation in dielectric constant of the paper-made base material in the non-contact card thereof. However, Patent document 2 does not show or suggest that the communication distance depends on the mounting state of the IC chip.

In the non-contact tag of Patent document 3, a resonance circuit is formed of a stray capacitance between the antenna coils formed on both surfaces of the dielectric substrate and an inductance of the antenna coils. Thus, the opening is enlarged while the non-contact tag is miniaturized, and the communication distance is improved. However, Patent document 3 does not show or suggest that the communication distance depends on the mounting state of the IC chip, similarly to Patent document 2. This structure is not so effective when ultra-short wave of about 956 MHz or microwave of about 2.45 GHz is used.

Generally, when thermoplastic resin base material such as polyethylene terephthalate (PET) resin is used as the base material of the non-contact card or the like, the resin substrate can deform depending on the condition of heating temperature, pressurizing load, or the like in connecting the IC chip to the antenna terminal of the antenna pattern. The antenna pattern including the antenna terminal is recessed by the deformation, and hence the interval between the circuit forming surface of the IC chip and the antenna terminal can become extremely short.

The inventors newly find that the communication distance significantly varies when the interval between the circuit forming surface of the IC chip and the antenna terminal decreases.

SUMMARY OF THE INVENTION

A non-contact card of the present invention has the following elements:

an IC chip having a function of storing information and processing a signal; and a resin substrate that is made of base material having thermoplasticity and has an antenna pattern for communicating a signal to an external device.

An antenna terminal disposed at one end of the antenna pattern on the resin substrate and an electrode terminal of the IC chip are mounted so that they face each other. There is a gap of at least 5 µm between the antenna pattern and the circuit forming surface of the IC chip.

In this structure, the stray capacitance between the circuit forming surface of the IC chip and the antenna terminal can be sufficiently reduced, so that a preset capacitance value does not shift. Therefore, the communication distance can be kept to be a designed value, and the variation can be significantly suppressed.

A manufacturing method of a non-contact card of the present invention has the following steps:

a resin supplying step of supplying insulating adhesive resin or anisotropic conductive resin onto an antenna terminal of a resin substrate where an antenna pattern is formed on a polyester base material;

an aligning step of arranging, on the resin substrate, an IC chip where a bump with a thickness of 5 µm or greater is formed on an electrode terminal, and aligning the bump and antenna terminal;

a mounting step of pressing and heating the IC chip and electrically coupling the bump to the antenna terminal in a direct contact manner or via the anisotropic conductive resin; and a hardening step of hardening the insulating adhesive resin or anisotropic conductive resin.

The applied pressure in the mounting step and hardening step is set in a range from 0.5 MPa to 2.5 MPa.

In this method, even when the resin substrate is made of polyester base material hardened by heating, deformation such as swelling of the resin substrate or denting of the antenna pattern by pressing can be suppressed in the mounting step and hardening step. As a result, the gap between the antenna terminal and the circuit forming surface of the IC chip can be set at 5 µm or wider, which is equal to the height of the bump, and the variation in communication distance can be suppressed.

REFERENCE MARKS IN THE DRAWINGS 10, 34, 38 resin substrate
12 base material
14 antenna pattern
16, 30 IC chip
18 silicon single crystal substrate
20 circuit forming surface
24 bump
26 dummy bump
28 anisotropic conductive resin
32, 36 insulating layer for gap regulation
40 reinforcing plate
42 hard plate
141 antenna terminal

DETAILED DESCRIPTION OF PREFERRED EMBODIMENTS

Exemplary embodiments of the present invention will be described hereinafter with reference to the drawings. In the following drawings, the same elements are denoted with the same reference marks, and some descriptions of those elements are omitted.

Figure 1A:
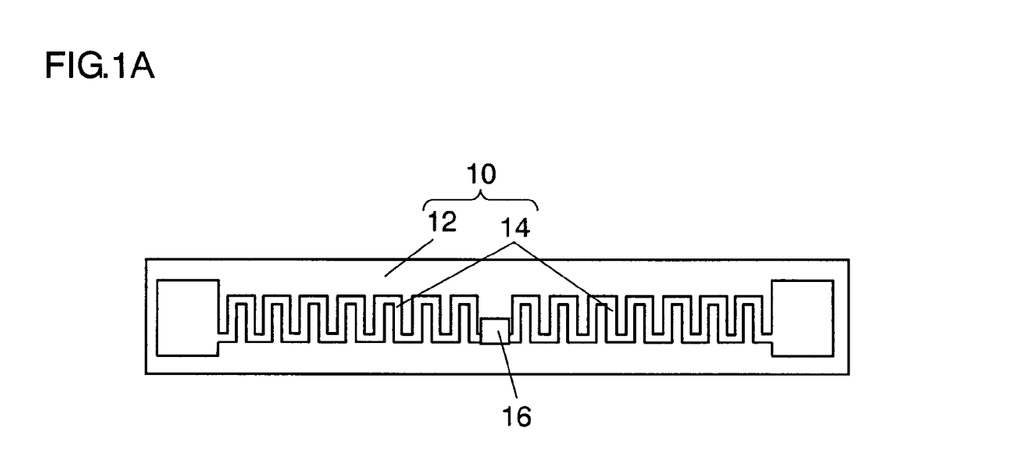
FIG. 1A is a plan view showing a whole structure of a non-contact card used by the present inventors.
Figure 1B:
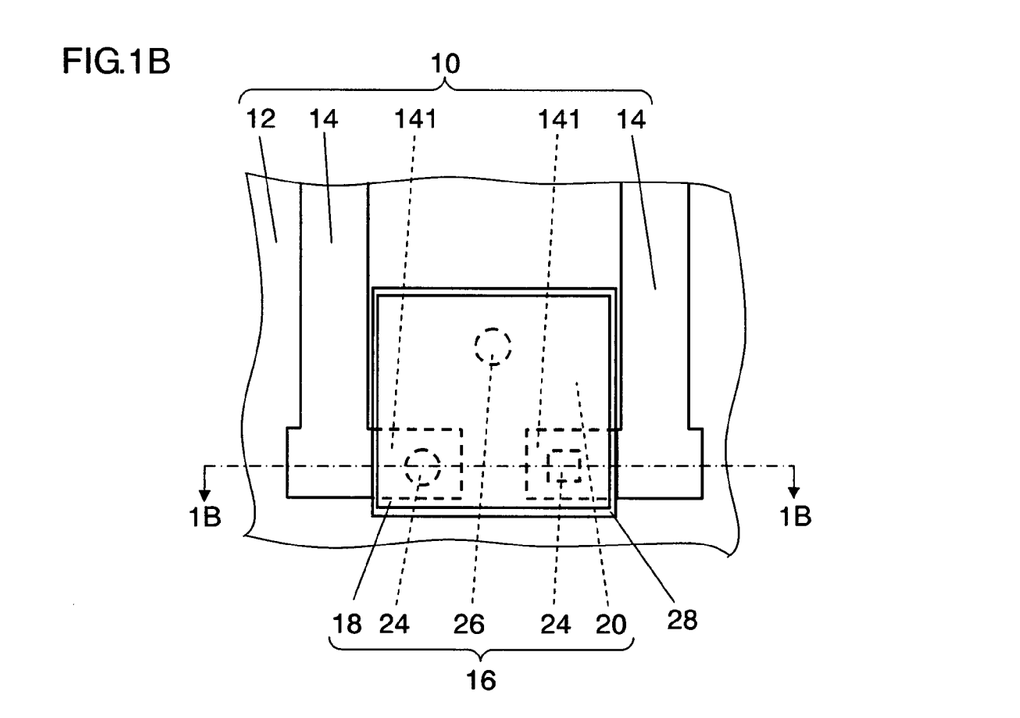
FIG. 1B is an enlarged plan view of a mounted unit of an IC chip of FIG. 1A.

First, results of the communication distance and variation in communication distance depending on the deformation of a resin substrate are described in the case where an IC chip is mounted to the resin substrate through anisotropic conductive resin. Here, the resin substrate is made of polyethylene terephthalate (PET) resin, namely thermoplastic resin, as base material FIG. 1A is a plan view showing the whole structure of a non-contact card used by the present inventors. FIG. 1B is an enlarged plan view of a mounting unit of the IC chip of FIG. 1A. The non-contact card has a structure corresponding to 2.45 GHz available in the microwave band.

IC chip 16 is produced by a known semiconductor process using silicon single crystal substrate 18. Various circuits including an analog circuit (not shown) and a ground circuit (not shown) are formed on the surface having bump 24, and this surface is circuit forming surface 20. The analog circuit and ground circuit (not shown) include region having bump 24, and are overlaid on antenna terminal 141. IC chip 16 used in this experiment has two bumps 24 and one dummy bump 26, and the outer shape thereof is a square of about 0.7 mm.

Resin substrate 10 is made of base material (thickness: about 100 μm) 12 of PET resin, and a pair of antenna patterns 14 made of aluminum (Al) foil (thickness: about 15 μm) are formed on base material 12. Antenna terminal 141 is disposed at one end of each antenna pattern 14. Antenna terminal 141 has an extremely large shape, namely a square of about 300 μm, comparing with the shape (size: about 80 μm, and thickness: about 15 μm) of bumps 24 in order to simplify the alignment in mounting IC chip 16. Therefore, the overlapping region (facing area) of circuit forming surface 20 of IC chip 16 and antenna terminals 141 is large.

Figure 2:
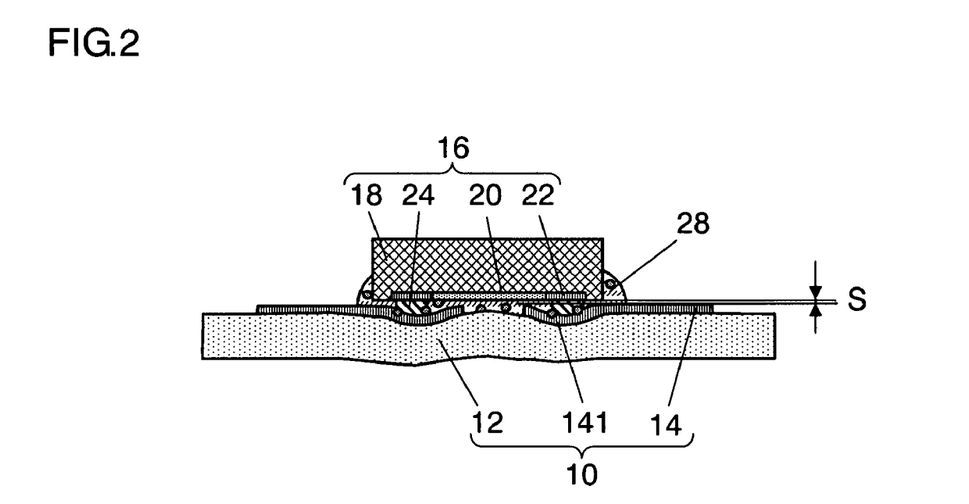
FIG. 2 is a sectional view taken along line 1B-1B of FIG. 1B, when the IC chip is mounted on a resin substrate shown in FIG. 1B using anisotropic conductive resin on the conventional mounting condition and hardening condition.

FIG. 2 is a sectional view taken along line 1B-1B of FIG. 1B, when IC chip 16 is mounted on resin substrate 10 using anisotropic conductive resin 28 on the conventional mounting condition and hardening condition. Anisotropic conductive resin 28 is mainly made of base resin, a hardening agent, and conductive fillers.

The conventional mounting condition and hardening condition are shown below. In this mounting condition, IC chip 16 is mounted at an applied pressure of 60 gf-100 gf at normal temperatures. In this hardening condition, IC chip 16 is hardened for 8 seconds at an applied pressure of 300 gf at a heating temperature of 180° C.-230° C.

When IC chip 16 is mounted on these conditions, base material 12 made of PET resin softens to cause recesses especially in regions of antenna terminals 141 of antenna patterns 14 made of Al foil. The recesses cause swelling between adjacent antenna terminals 141. According to observation by a microscope, gap S between antenna terminals 141 and circuit forming surface 20 of IC chip 16 is about 1 μm. Gap S is measured at a plurality of places, and the average of the measured values is derived. The communication distance of the non-contact card having such a gap is 0.3 m.

When IC chip 16 is mounted on resin substrate 10 using the same anisotropic conductive resin 28 with the applied pressure varied, the relationship between the measured value of the gap and the communication distance is shown in Table 1.

TABLE 1

| Gaps: S (pm) | Frequencies: 956 MHz | | Frequencies: 2.45 GHz | |
|---|---|---|---|---|
| | Center Value (m) | Variation | Center Value (m) | Variation |
| 1 | 2 | 1~5 | 0.6 | 0.3~1.2 |
| 3 | 4.5 | 1~7 | 0.8 | 0.3~1.4 |
| 5 | 7 | 7~9 | 1.3 | 1.2~1.4 |
| 10 | 7.2 | 7~9 | 1.3 | 1.2~1.4 |
| 15 | 7.5 | 7~9 | 1.3 | 1.2~1.4 |

The gap is determined by measuring the communication distance and then observing the cross section of the non-contact card with a microscope. The communication distance is measured on the same condition using the same reader/writer.

As a result, as shown in Table 1, when the measured value of the gap is smaller than 5 μm, the communication distance is short and the variation is large.

Table 1 also shows the result of the measurement by a similar method at 956 MHz available in the UHF band. The structure of the antenna pattern at 956 MHz is different from that in FIG. 1, but the shape of the mounting region of the IC chip is substantially the same. As shown in Table 1, even at 956 MHz, setting the gap at 5 μm or wider can increase the communication distance and decrease the variation thereof, similarly to the case at 2.45 GHz.

The communication distance of the non-contact card depends on the power consumption of a circuit formed on the IC chip in the non-contact card and the conversion efficiency of radio wave received from the reader/writer into direct current (DC). Generally, communication distance (D) is proportional to the ½th power of transmitted power (P) and the ½th power of antenna gain, and is inversely proportional to frequency (f). When antenna gain (G) is increased by four times (6 dB), communication distance (D) increases by two times.

In the non-contact card, generally, the mounting is performed so that the analog circuit and ground circuit on the circuit forming surface of the IC chip are overlaid on the antenna terminals. That is because there are only two bumps on the IC chip, and precise alignment is dispensed with in order to reduce the mounting cost, and high-speed mounting is performed.

When the overlaying (facing area) of the antenna terminals on the analog circuit and ground circuit and the interval between them vary in mounting, the stray capacitance varies. The variation in stray capacitance reduces the Q value, so that it is estimated that the communication distance becomes short and the variation in communication distance becomes large.

When a base material made of thermoplastic resin is used, the stray capacitance varies in a step of mounting the IC chip on the resin substrate. The variation in stray capacitance is caused by narrowing of the gap due to variation in temperature and applied pressure that are actually transferred to the resin substrate and by variation in the overlaying state of the antenna terminals on the ground circuit. Especially when the gap narrows, the stray capacitance sharply increases. In other words, the influence of the gap is larger than that of the overlaying state.

Therefore, controlling the gap is found to be important.

Increasing the height of the bump is effective for widening the gap, but the cost of the IC chip is increased disadvantageously. Therefore, the height of the bump on the IC chip is preferably set to the minimum.

Specific exemplary embodiments of the present invention will be described.

First Exemplary Embodiment

Figure 3:
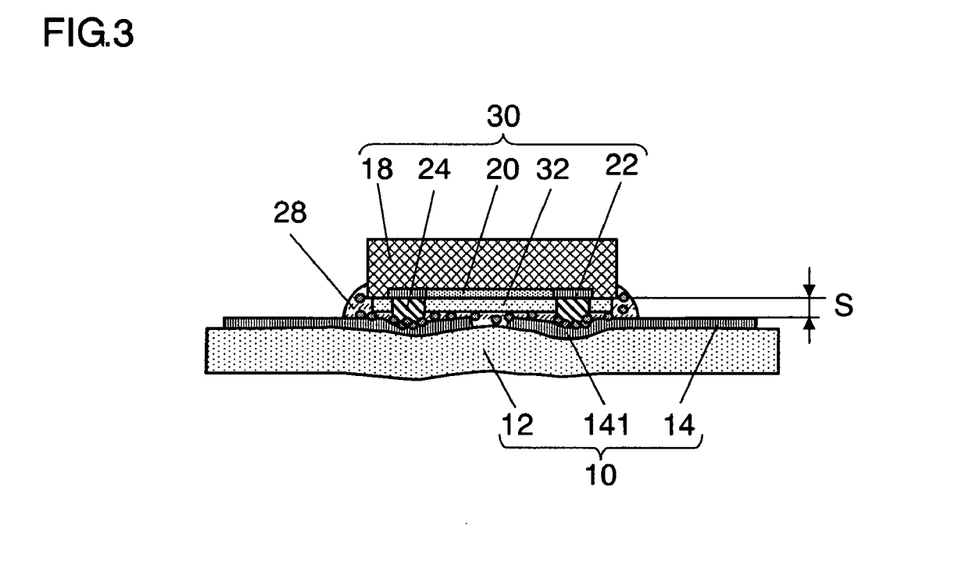
FIG. 3 is a sectional view taken along line 1B-1B of FIG. 1B that shows a structure of a non-contact card in accordance with a first exemplary embodiment of the present invention.
Figure 4A:
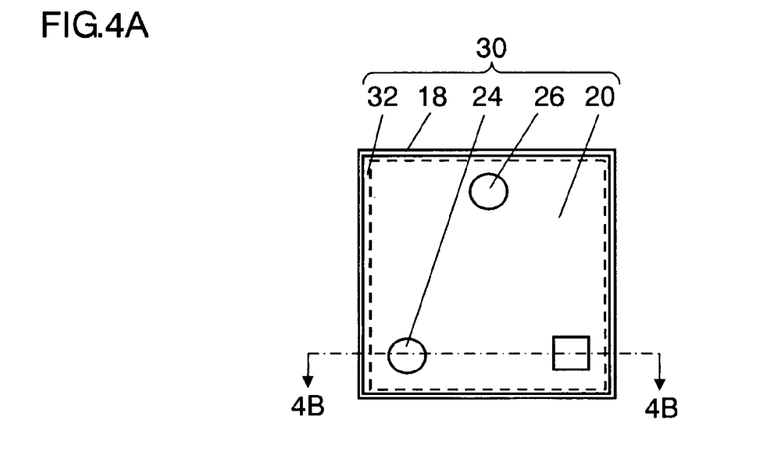
FIG. 4A is a plan view from a circuit forming surface showing the structure of an IC chip in the non-contact card in accordance with the first exemplary embodiment.
Figure 4B:
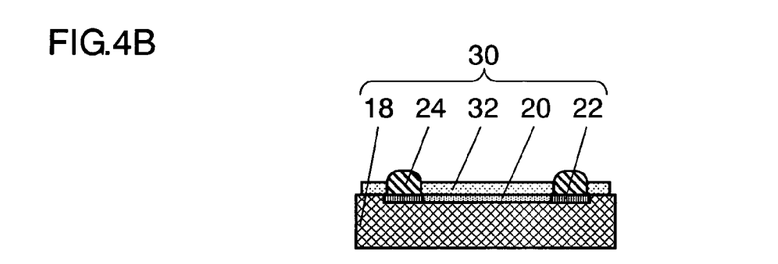
FIG. 4B is a sectional view taken along line 4B-4B of FIG. 4A.

FIG. 3 is a sectional view taken along line 1B-1B of FIG. 1B that shows a structure of a non-contact card in accordance with a first exemplary embodiment of the present invention. FIG. 4A is a plan view from a circuit forming surface of IC chip 30 in the non-contact card in accordance with the first exemplary embodiment. FIG. 4B is a sectional view taken along line 4B-4B of FIG. 4A. In the present exemplary embodiment, an example employing the resin substrate shown in FIG. 1A and FIG. 1B is described.

The non-contact card of the present exemplary embodiment has the following elements:
IC chip 30 having a function of storing at least information; and
resin substrate 10 that is made of base material 12 having thermoplasticity and has antenna patterns 14 for communicating a signal to an external device.

Antenna terminal 141 disposed at one end of each antenna pattern 14 on resin substrate 10 and electrode terminal 22 of IC chip 30 are interconnected by a flip chip method. Gap S of at least 5 μm is formed between antenna patterns 14 and the circuit forming surface of IC chip 30.

Here, gap S means the gap between antenna terminals 141 and the surface having an analog circuit (not shown) and a ground circuit (not shown), of circuit forming surface 20 of IC chip 30. An analog circuit and a ground circuit are also disposed near electrode terminal 22 that is coupled to antenna terminals 141.

Insulating layer 32 for gap regulation is formed on the surface having at least the analog circuit and ground circuit, of circuit forming surface 20 of IC chip 30. Here, insulating layer 32 has a thickness that is 5 μm or greater and is less than the height of bumps 24 formed on the surface of electrode terminals 22 of IC chip 30.

The present exemplary embodiment is described hereinafter in more detail.

Resin substrate 10 is made of base material (thickness: about 100 μm) 12 such as PET resin, and antenna patterns 14 made of Al foil (thickness: about 15 μm) are formed on base material 12. Antenna terminal 141 is disposed at one end of each antenna pattern 14.

IC chip 30 is produced by a known semiconductor process using silicon single crystal substrate 18. Various circuits including an analog circuit (not shown) and a ground circuit (not shown) are formed on the surface having bumps 24. The analog circuit and ground circuit include a region having bumps 24, and are disposed in a region overlaid on antenna terminals 141.

In the present exemplary embodiment, insulating layer 32 for gap regulation is formed on a substantially whole surface including circuit forming surface 20. Insulating layer 32 can be formed using photoresist film, for example. Alternatively, insulating layer 32 may be formed using liquid photosensitive or non-photosensitive polyimide. Insulating layer 32 is preferably formed before forming bumps 24 in order to simplify the process, but may be formed after forming bumps 24. Insulating layer 32 is preferably formed in a wafer state before individual IC chip 30 is formed. The thickness of insulating layer 32 is set at 5 μm or greater with reference to the surface of circuit forming surface 20, but is set less than the height of bumps 24. When the height of bumps 24 is set at 15 μm or more, the thickness of insulating layer 32 is set in a range from 5 μm to 15 μm, preferably set at about 7 μm, for example.

By forming insulating layer 32 for gap regulation, gap S between antenna terminals 141 and circuit forming surface 20 can be set at 5 μm or wider even when the mounting is performed on the condition same as the conventional condition using conventional anisotropic conductive resin 28 as shown in FIG. 3.

By previously forming insulating layer 32 on circuit forming surface 20 of IC chip 30, gap S between antenna terminals 141 and circuit forming surface 20 of IC chip 30 can be certainly set at 5 μm or wider even when resin substrate 10 deforms in the step of mounting IC chip 30 on resin substrate 10.

As a result, even if positional displacement of bumps 24 coming into contact with antenna terminals 141 and variation in mounting condition occur, variation in communication distance can be reduced. Therefore, even when resin substrate 10 made of base material 12 such as inexpensive thermoplastic resin is used, a non-contact card of high yield can be produced.

Insulating layer 32 for gap regulation may be made of epoxy resin instead of the photoresist or polyimide resin. An example of the epoxy resin may be bisphenol F epoxy resin, amine epoxy resin, or cycloaliphatic epoxy resin. Polyester resin, polyimide resin, or acrylic resin may be used. When epoxy-resin-based thermosetting resin is used, amine, imidazole, amine adduct, or acid anhydride is preferably used as a hardening agent. As the epoxy resin, an equivalent mixture of JER-manufactured Ep828 and Ep806 may be used, for example. As the imidazole-based hardening agent, 2P4MHZ manufactured by Shikoku Chemicals Corporation may be used.

In the present exemplary embodiment, insulating layer 32 for gap regulation is formed separately from a dicing region of the outer periphery of IC chip 30. However, insulating layer 32 may be formed on the whole surface of the wafer, and insulating layer 32 may be cut simultaneously in dicing the silicon wafer.

In the present exemplary embodiment, insulating layer 32 for gap regulation is formed on a substantially whole surface of circuit forming surface 20 of IC chip 30. However, the present invention is not limited to this. As shown also in FIG. 3, even when insulating layer 32 is formed only in the region overlaid on antenna terminals 141, a similar advantage can be obtained.

IC chip 30 used in the non-contact card of the present exemplary embodiment requires only two bumps 24, but has also dummy bump 26 in order to stabilize the mounting position of IC chip 30.

Resin substrate 10 may be made of acrylonitrile butadiene styrene (ABS), polyvinyl chloride (PVC), polycarbonate, polyethylene naphthalate (PEN), or polyethylene terephthalate glycol (PETG), instead of polyethylene terephthalate (PET). Antenna patterns 14 may be made of copper (Cu) foil or nickel (Ni) foil, instead of Al foil. When the Cu foil is used, however, anti-oxidant coating is preferably formed on the surface thereof. Antenna patterns 14 may be formed, by printing, of conductive resin paste made of silver (Ag), conductive powder of Ag or Ag—Pd alloy, or thermosetting resin, instead of metal foil. When the conductive paste is used as antenna patterns 14, the thickness thereof is set at 15 μm-30 μm, preferably 25 μm, and the surface roughness is preferably set within 5 μm.

Second Exemplary Embodiment

Figure 5:
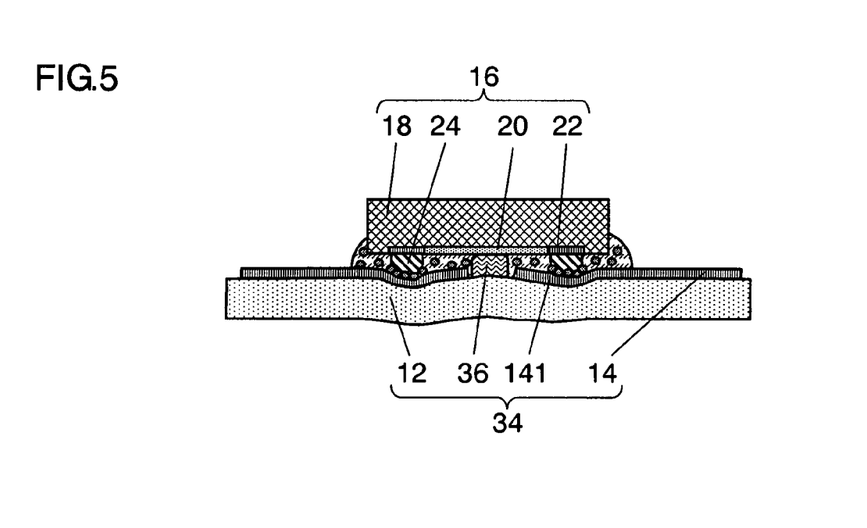
FIG. 5 is a sectional view showing the structure of a non-contact card in accordance with a second exemplary embodiment of the present invention.
Figure 6A:
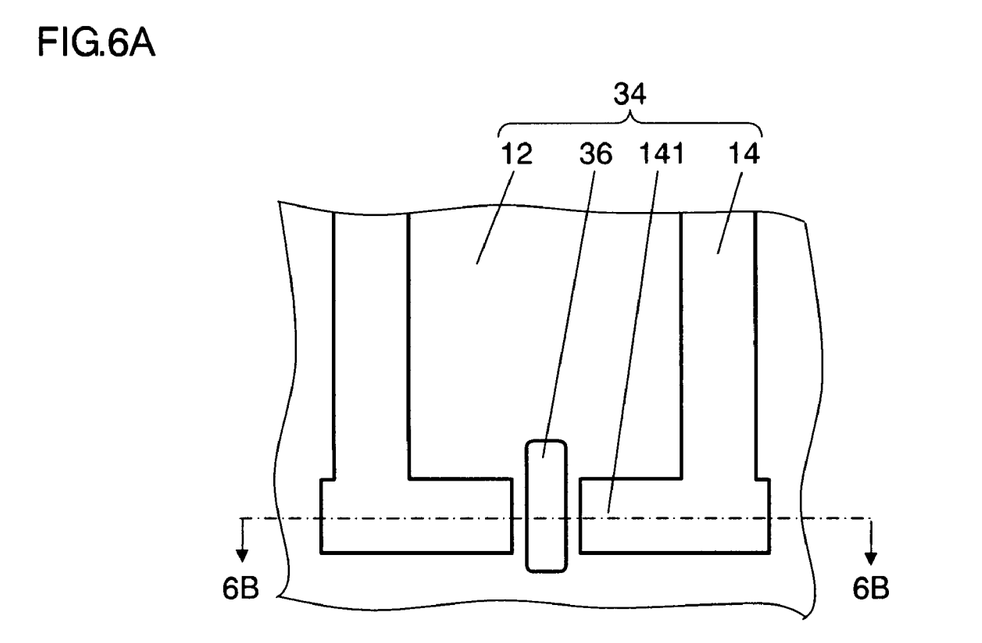
FIG. 6A is a plan view of a region mounted with an IC chip as an essential structure of a resin substrate in the non-contact card in accordance with the second exemplary embodiment.
Figure 6B:
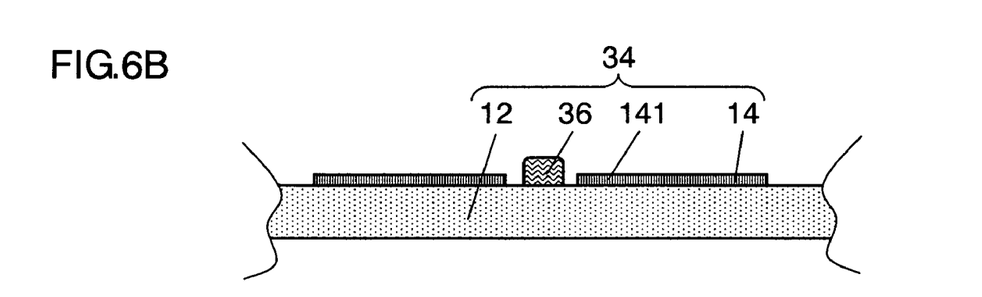
FIG. 6B is a sectional view taken along line 6B-6B of FIG. 6A.

FIG. 5 is a sectional view showing the structure of a non-contact card in accordance with a second exemplary embodiment of the present invention. In the non-contact card of the present exemplary embodiment, IC chip 16 has the same structure as the conventional structure. FIG. 6A is a plan view of a region mounted with IC chip 16 of a resin substrate in accordance with the present exemplary embodiment. FIG. 6B is a sectional view taken along line 6B-6B of FIG. 6A. As shown in FIG. 6A and FIG. 6B, the essential structure of resin substrate 34 is the same as that of resin substrate 10 of FIG. 1. In the present exemplary embodiment, insulating layer 36 for gap regulation is formed on base material 12 of resin substrate 34 between adjacent antenna terminals 141. Here, insulating layer 36 has a thickness that is greater than the thickness of antenna terminals 141 by 5 μm or greater and is less than the sum of the height of bumps 24 formed on the surfaces of electrode terminals 22 of IC chip 16 and the thickness of antenna terminals 141.

Insulating layer 36 for gap regulation can be formed by a printing method using resist ink, for example. Alternatively, insulating layer 36 may be formed by applying liquid photosensitive resist material to the whole surface of the base material and then by processing it by exposure process. In this case, insulating layer 36 for gap regulation may be formed on the whole region on which IC chip 16 is to be formed. Insulating layer 36 is preferably formed on base material 12 of resin substrate 34 in a sheet state having many resin substrates 34 before dividing into separate resin substrates 34. Thus, insulating layers 36 can be collectively formed on many resin substrates 34.

The thickness of insulating layer 36 for gap regulation is set greater than the thickness of antenna terminals 141 by 5 μm or greater and is less than the sum of the height of bumps 24 formed on the surfaces of electrode terminals 22 of IC chip 16 and the thickness of antenna terminals 141. In other words, when the thickness of antenna terminals 141 is set at 15 μm and the height of bumps 24 is set at 15 μm, the thickness of insulating layer 36 is set as below. The thickness of insulating layer 36 is set at 20 μm or greater because it is required to be greater than the thickness (15 μm) of antenna terminals 141 by 5 μm or greater. The thickness of insulating layer 36 is set less than the sum (30 μm) of the thickness (15 μm) of antenna terminals 141 and the height (15 μm) of bumps 24. When the thickness is set at about 23 μm, coupling through anisotropic conductive resin 28 can be certainly performed, and 5 μm or more can be certainly secured as the gap after the coupling.

Since insulating layer 36 is previously formed on base material 12 of resin substrate 34 between antenna terminals 141, the gap between circuit forming surface 20 of IC chip 16 and antenna terminals 141 can be certainly kept to be 5 μm, or wider even if resin substrate 34 deforms in the step of mounting IC chip 16 on resin substrate 34. As a result, even if positional displacement of bumps 24 coming into contact with antenna terminals 141 and variation in mounting condition occur, the variation in communication distance can be reduced. Therefore, even when resin substrate 34 made of base material 12 such as inexpensive thermoplastic resin is used, a non-contact card of high yield can be produced.

Insulating layer 36 for gap regulation may be made of not only resist ink or photosensitive resist material but also epoxy resin or polyimide resin. An example of the epoxy resin may be bisphenol F epoxy resin, amine epoxy resin, or cycloaliphatic epoxy resin. Polyester resin, polyimide resin, or acrylic resin may be used. When epoxy-resin-based thermosetting resin is used, amine, imidazole, amine adduct, or acid anhydride is preferably used as a hardening agent. As the epoxy resin, an equivalent mixture of JER-manufactured Ep828 and Ep806 may be used, for example. As the imidazole-based hardening agent, 2P4MHZ manufactured by Shikoku Chemicals Corporation may be used.

In the present exemplary embodiment, insulating layer 36 for gap regulation is formed on base material 12 of resin substrate 34 between adjacent antenna terminals 141. However, the present invention is not limited to this. For example, an insulating layer for gap regulation having a thickness that is 5 μm or greater and is less than the height of bumps 24 formed on the surfaces of electrode terminals 22 of IC chip 16 may be formed in the region overlaid on IC chip 16 on antenna patterns 14 including antenna terminals 141. Thus, the gap is regulated in the outer peripheral region of IC chip 16, so that the gap of 5 μm or wider can be obtained certainly and reproducibly.

Third Exemplary Embodiment

Figure 7A:
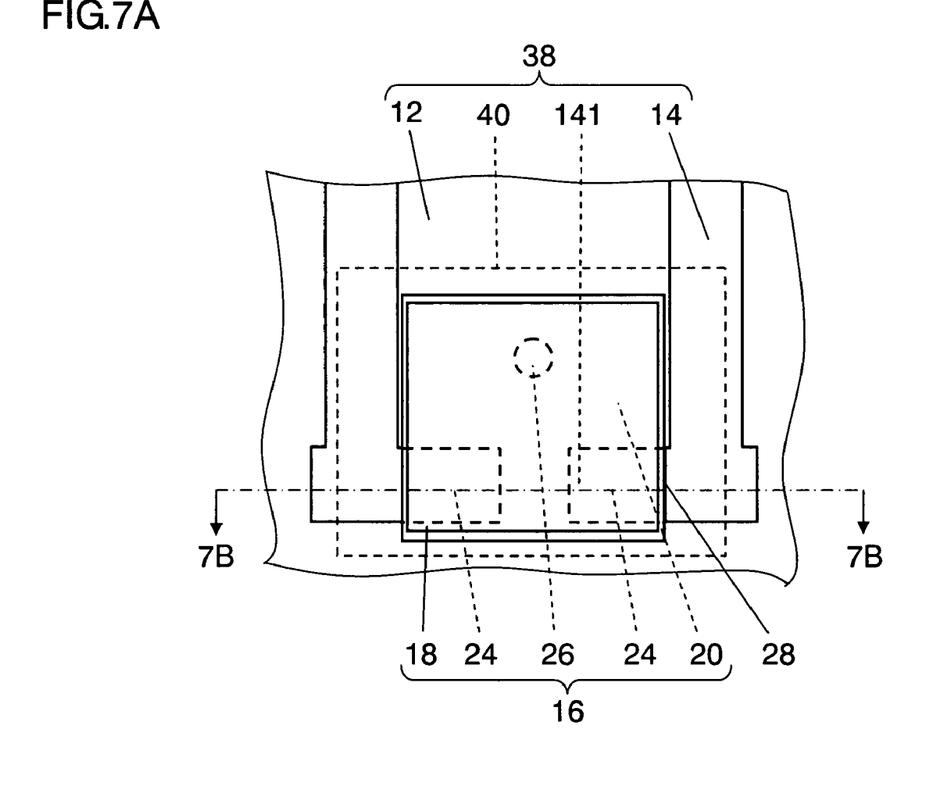
FIG. 7A is a plan view showing the structure of a non-contact card in accordance with a third exemplary embodiment of the present invention.
Figure 7B:
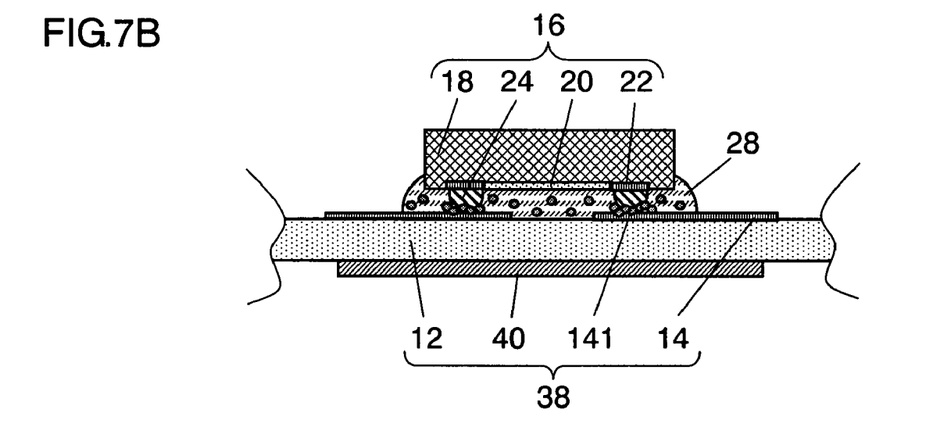
FIG. 7B is a sectional view taken along line 7B-7B of FIG. 7A.

FIG. 7A is a plan view showing the structure of a non-contact card in accordance with a third exemplary embodiment of the present invention. FIG. 7B is a sectional view taken along line 7B-7B of FIG. 7A. In the non-contact card of the present exemplary embodiment, IC chip 16 is mounted on resin substrate 38 having a structure different from that of resin substrate 10 shown in FIG. 1A and FIG. 1B.

Different points from resin substrate 10 of FIG. 1A and FIG. 1B are mainly described hereinafter. Resin substrate 38 of the present exemplary embodiment is formed by producing resin substrate 10 as shown in the first exemplary embodiment and then disposing reinforcing plate 40 with a size at least larger than the area of a plurality of antenna terminals 141 on the surface facing the surface to be mounted with IC chip 16. In the present exemplary embodiment, reinforcing plate 40 is larger than the size of IC chip 16, has a shape overlaid on antenna patterns 14 including adjacent antenna terminals 141, and is stuck and fixed to base material 12 of resin substrate 38.

As reinforcing plate 40, resin material having hardness, bending modulus, and heat resistance larger than those of resin substrate 38 is preferably employed. Thermoplastic resin such as epoxy resin, melanin resin, or diallyl phthalate resin can be used. Alternatively, resin containing glass fiber may be used. When a sheet made of such resin is stuck and fixed through an adhesive, swelling of resin substrate 38 between antenna terminals 141 can be suppressed by action of reinforcing plate 40 even if base material 12 of resin substrate 38 is softened by heating and pressurizing during the mounting. Therefore, a gap amount substantially equal to the height of bumps 24 can be kept.

The optimum thickness of reinforcing plate 40 depends on the thickness of base material 12 of resin substrate 38. When the thickness of base material 12 is set at 100 μm or less, the thickness of reinforcing plate 40 is preferably set at about 10 μm-30 μm. Reinforcing plate 40 may be produced by a method of forming it using resin material by printing and of hardening it.

Fourth Exemplary Embodiment

Figure 8A:
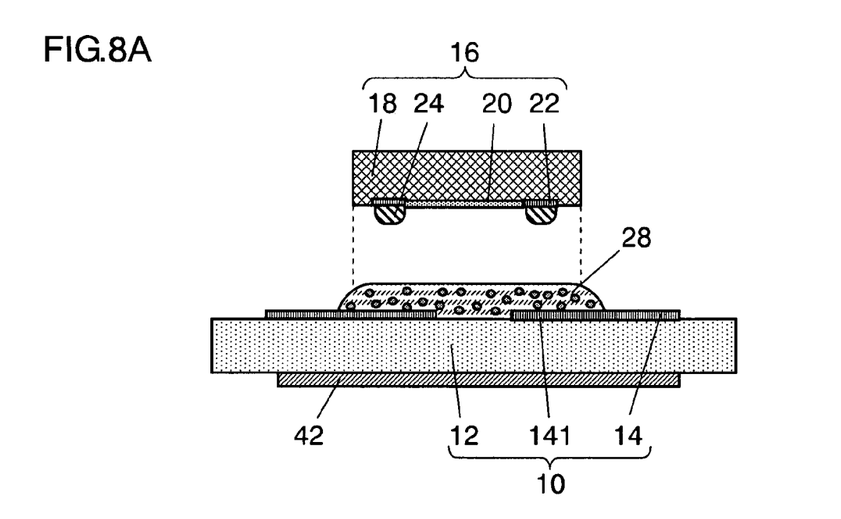
FIG. 8A is a sectional view showing a state obtained by aligning an IC chip to a resin substrate to which a hard plate is stuck in an essential step for describing the manufacturing method of a non-contact card in accordance with a fourth exemplary embodiment of the present invention.
Figure 8B:
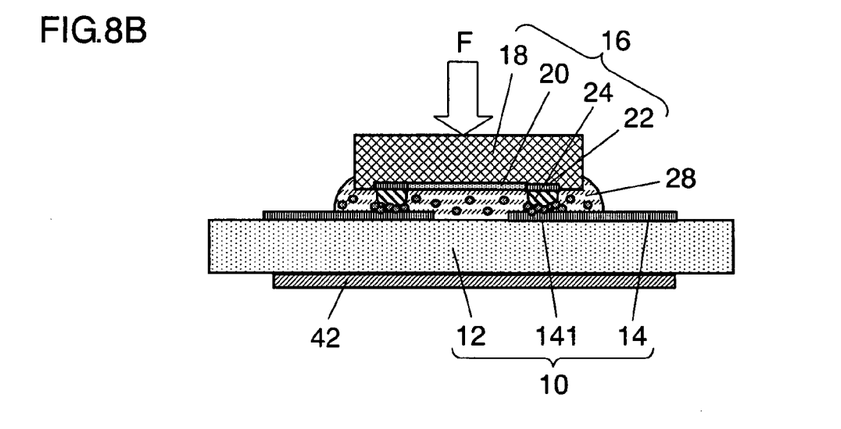
FIG. 8B is a sectional view showing a state obtained by pressing the IC chip and coupling a bump to an antenna terminal via anisotropic conductive resin in an essential step for describing the manufacturing method of the non-contact card in accordance with the fourth exemplary embodiment of the present invention.
Figure 8C:
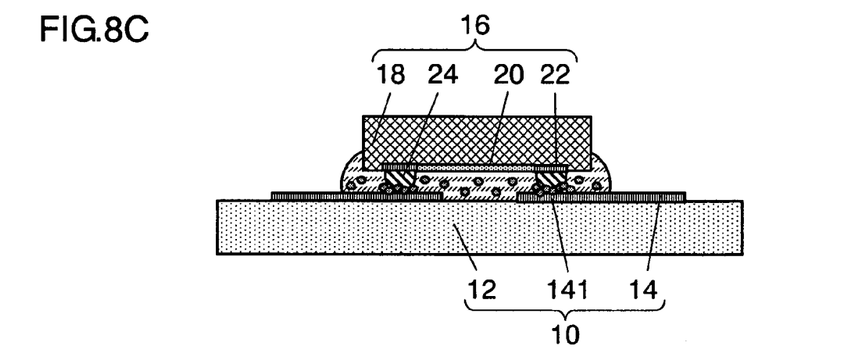
FIG. 8C is a sectional view showing a state obtained by coupling the IC chip and then removing the hard plate in an essential step for describing the manufacturing method of the non-contact card in accordance with the fourth exemplary embodiment.

FIG. 8A through FIG. 8C are sectional views of essential steps for describing a manufacturing method of a non-contact card in accordance with a fourth exemplary embodiment of the present invention. FIG. 8A is a sectional view showing a state obtained by aligning IC chip 16 to resin substrate 10 to which hard plate 42 is stuck. FIG. 8B is a sectional view showing a state obtained by pressing IC chip 16 and coupling bumps 24 to antenna terminals 141 via anisotropic conductive resin 28. FIG. 8C is a sectional view showing a state obtained by coupling IC chip 16 and then removing hard plate 42.

First, resin substrate 10 having antenna patterns with predetermined shapes is produced. As base material 12 of resin substrate 10, PET resin with a thickness of 50 μm-100 μm is used. Antenna patterns 14 made of Al foil are formed on the surface of base material 12. The thickness of Al foil is about 15 μm. After forming antenna patterns 14 in this manner, hard plate 42 with a shape larger than the region including antenna terminals 141 is stuck and fixed to base material 12.

Next, in FIG. 8A, anisotropic conductive resin 28 is applied to the mounting region of IC chip 16 including antenna terminals 141, and IC chip 16 is arranged on antenna terminals 141. Bumps 24 having a laminated structure of Ni and gold (Au) are disposed on electrode terminals 22 disposed on circuit forming surface 20 of IC chip 16. The height of bumps 24 is set at about 15 μm.

Next, in FIG. 8B, IC chip 16 is pressed by load F and pressurized until bumps 24 are electrically coupled to antenna terminals 141 via anisotropic conductive resin 28. As the mounting condition at this time, heating temperature, time, and applied pressure are 180° C., 1 second, and 2 MPa, respectively. As the hardening condition after that, heating temperature, time, and applied pressure are 150° C., 30 seconds, and 2 MPa, respectively. The hardening step is performed in a state where IC chip 16 is handled by a crimp head. Since such mounting condition and hardening condition are employed and hard plate 42 is disposed on the rear surface of base material 12, swelling hardly occurs in resin substrate 10 between antenna terminals 141, and a gap amount substantially the same as the height of bumps 24 can be kept stably.

When PET resin is used as base material 12, the applied pressure is preferably set in the range of 0.5 MPa-2.5 MPa. When the applied pressure is lower than 0.5 MPa, conductor particles in anisotropic conductive resin 28 cannot sufficiently come into electric contact with each other, and coupling resistance is apt to vary. When the applied pressure is higher than 2.5 MPa, recesses are apt to occur in pressed parts of the antenna patterns, and the gap becomes narrower than the bump height. Therefore, when the bump height is close to 5 μm, the gap can be 5 μm or narrower due to the recesses. As a result, the applied pressure is preferably set in the range of 0.5 MPa-2.5 MPa, more preferably 1.5 MPa-2.5 MPa. The latter setting can more certainly suppress the variation in coupling resistance.

The range of the applied pressure is similar to the case of coupling via insulating adhesive resin.

Next, in FIG. 8C, IC chip 16 is coupled to resin substrate 10 electrically and mechanically, and then hard plate 42 is removed. Assuming that hard plate 42 is transparent glass, for example, this removal is facilitated by using an adhesive whose adhesiveness is eliminated by radiation of ultraviolet rays. Even when hard plate 42 is removed, the gap between IC chip 16 and antenna terminals 141 of resin substrate 10 does not vary, and width of 5 μm or more can be secured.

In the manufacturing method of the present exemplary embodiment, the ultimate shape is the same as that of a conventional non-contact card, but the gap can be secured stably. Therefore, the communication distance can be long and variation in communication distance can be small. As a result, the non-contact card can be produced at a high yield. The hard plate is stuck to the base material of the resin substrate in the manufacturing method of the present exemplary embodiment; however, a gap can be secured even when the hard plate is not stuck in a manufacturing method of the present invention. However, sticking the hard plate can enlarge the tolerance of the variation of the conditions in the mounting step and hardening step, and allows high-yield manufacturing.

As the anisotropic conductive resin of the present invention, a mixture can be used that is produced by mixing conductor particles made of spherical Ag powder, Cu powder, or Ag—pd alloy powder into a binder whose base resin is bisphenol epoxy resin and amine epoxy resin. Conductor particles produced by plating resin balls with laminated film of Ni and Au or conductor of Ag or Cu may be employed.

PET resin is used as the base material of the resin substrate in the present exemplary embodiment; however, ABS, PVC, polycarbonate, PEN, or PETG may be used.

In the first exemplary embodiment through fourth exemplary embodiment, the IC chip is coupled to the antenna terminal via anisotropic conductive resin. However, the present invention is not limited to this. A similar advantage can be obtained even in a coupling method of mechanically bringing the bump of the IC chip into contact with the antenna terminal using nonconductive, insulating resin such as epoxy resin.

INDUSTRIAL APPLICABILITY

In the non-contact card and its manufacturing method of the present invention; the gap between an antenna terminal and a circuit forming surface of an IC chip can be kept 5 μm or wider. Thus, the influence of stray capacitance is suppressed, variation in communication distance can be reduced, and relatively high communication distance can be obtained. Therefore, the non-contact card and its manufacturing method are useful for a field using a non-contact information storage medium such as an RF tag.

The invention claimed is:

1. A non-contact information storage medium comprising:
   an IC chip having a function of storing information and processing a signal, the IC chip having electrode terminals disposed on a circuit surface of the IC chip;
   a resin substrate made of a base material having thermoplasticity, the resin substrate having an antenna pattern for communicating a signal to an external device, the antenna pattern having antenna terminals at respective ends of the antenna pattern;
   an insulating layer for gap regulation disposed on the resin substrate between the antenna terminals, the insulating layer having a thickness that is greater than thickness of the antenna terminals by 5 μm or greater and is less than the sum of height of a bump disposed on a surface of the electrode terminal of the IC chip and thickness of the antenna terminal; and
   anisotropic conductive resin or insulating resin, which is different from the insulating layer, for coupling the bump disposed on the electrode terminal to the antenna terminals, wherein:
   the antenna terminals disposed on the resin substrate and the electrode terminal of the IC chip are mounted so that the antenna terminal faces the electrode terminal, and
   a gap of at least 5 μm is disposed between the antenna pattern and the circuit surface of the IC chip.

2. The non-contact information storage medium of claim 1, wherein
   the insulating layer for gap regulation is made of one of thermosetting resin material, thermoplastic resin material, ultraviolet cured resin, and a mixture of them.

3. A manufacturing method of the non-contact information storage medium, the method comprising:
   a sticking step of sticking a hard plate with a shape at least larger than area of the plurality of antenna terminals to a surface facing a surface mounted with the IC chip of the base material in the resin substrate;
   a resin supplying step of supplying one of insulating adhesive resin and anisotropic conductive resin onto an antenna terminal of a resin substrate, an antenna pattern being formed on a polyester base material in the resin substrate;
   an aligning step of arranging an IC chip having a bump on the resin substrate and aligning the bump and antenna terminal, the bump having a thickness of 5 μm or greater and being formed on a surface of an electrode terminal;
   a mounting step of pressing and heating the IC chip, and electrically coupling the bump to the antenna terminal in a direct contact manner or via the anisotropic conductive resin;
   a hardening step of hardening one of the insulating adhesive resin and the anisotropic conductive resin; and
   a removing step of removing the hard plate,
   wherein applied pressure in the mounting step and the hardening step is set in a range from 0.5 MPa to 2.5 MPa.

4. The manufacturing method of the non-contact information storage medium of claim 3, wherein:
   the IC chip has a circuit forming surface on which an analog circuit and a ground circuit n electrode terminal disposed on a circuit surface of the IC chip, and
   the IC chip has an insulating layer disposed on the circuit forming surface, the insulating layer having a thickness that is 5 μm or greater and is less than height of the bump formed on the surface of the electrode terminal of the IC chip.

5. The manufacturing method of the non-contact information storage medium of claim 3, wherein:
the antenna terminal includes two antenna terminals, and
the insulating layer is disposed between the two antenna terminals, the insulating layer having a thickness that is less than the sum of height of the bump of the IC chip and thickness of the antenna terminals.

6. The manufacturing method of the non-contact information storage medium of claim 3, wherein:
the insulating layer is disposed on the antenna pattern including the antenna terminal and on a region overlaid on the IC chip, and
the insulating layer having a thickness that is 5 μm or greater and is less than height of the bump formed on the surface of the electrode terminal of the IC chip.

* * * * *